United States Patent [19]

Waku et al.

[11] 3,764,931

[45] Oct. 9, 1973

[54] GAIN CONTROL CIRCUIT

[75] Inventors: Toshihiko Waku, Yokohama; Yoshio Ota, Fujisawa, both of Japan

[73] Assignee: Sony Corporation, Tokyo, Japan

[22] Filed: Oct. 16, 1972

[21] Appl. No.: 297,769

[30] Foreign Application Priority Data

Oct. 15, 1971 Japan ............................... 46/81957

[52] U.S. Cl. .................... 330/29, 307/264, 328/168, 330/145

[51] Int. Cl. ........................... H03g 3/30, H03f 1/30

[58] Field of Search .................... 307/237, 239, 240, 307/241, 264; 328/168, 169, 171, 172, 173, 175; 330/29, 144, 145

[56] References Cited

UNITED STATES PATENTS 3,036,275 5/1962 Harmer ................................ 330/29
3,500,222 3/1970 Kozawa ................................ 330/29
3,530,308 9/1970 Pawletko ......................... 328/171 X
3,651,420 3/1972 Giontzeneli et al. .............. 330/29 X
3,652,791 3/1972 Shuey .............................. 330/29 X
3,714,598 1/1973 Wakai et al. ........................ 330/29

*Primary Examiner*—John S. Heyman
*Assistant Examiner*—L. N. Anagnos
*Attorney*—Lewis H. Eslinger et al.

[57] ABSTRACT

A gain control circuit having a pair of first and second NPN-type transistors whose emitters are grounded and whose collectors are connected with each other and through a constant current source to a DC source. A third NPN-type transistor has its collector connected to the DC source, its emitter connected to the bases of the first and second transistors through separate resistors and also grounded through a resistor connected in parallel with a capacitor, and its base connected to the collector of the first transistor. A PNP-type transistor has its emitter connected to the base of the first transistor and its collector grounded. An input signal is applied to the base of the first transistor and a control signal is applied to the base of the PNP-type transistor.

7 Claims, 4 Drawing Figures

GAIN CONTROL CIRCUIT

BACKGROUND OF THE INVENTION

This invention relates in general to gain control circuits and more particularly to a gain control circuit suitable for manufacture as an integrated circuit.

There have been proposed a number of gain control circuits, but few of such gain control circuits are wide in gain control range and are also suitable for manufacture in an integrated circuit form because they utilize a number of components, such as capacitors, which are difficult to incorporate in an integrated circuit. Further, conventional gain control circuits suitable for manufacture as integrated circuits have the drawback that their gains change due to variation of the voltage of the electric power source and their distortion factors at large inputs are not satisfactory.

SUMMARY OF THE INVENTION

A preferred embodiment of the present invention of a gain control circuit comprises first and second transistors each having base, emitter and collector electrodes respectively, means for connecting the collector electrodes of the first and second transistors to each other, a circuit ground, means for connecting the emitter electrodes of the first and second transistors to the circuit ground, a constant current source connected between the collector electrodes of the first and second transistors and the circuit ground, means for applying an input signal between the base electrode of the first transistor and the circuit ground, means for applying a DC bias to the base electrode of at least one of the first and second transistors in direct response to changes in the DC voltage of the collector electrodes of the first and second transistors, and variable impedance means responsive to an external gain control signal connected between the base electrode of the first transistor and the circuit ground. The signal output is obtained from the collector electrode of the first transistor.

In one embodiment the DC base bias means includes a third transistor having base, emitter and collector electrodes and means for connecting the base electrode of the third transistor to the collector electrode of the first transistor. The emitter electrode of the third transistor is grounded through impedance means, and is also connected to the base electrodes of the first and second transistors. The variable impedance means includes a fourth transistor which is opposite to the first, second and third transistors in conductivity type. The fourth transistor is connected at its emitter electrode to the base electrode of the first transistor, at its collector electrode to the circuit ground and the external gain control signal is supplied to its base electrode. In some embodiments means are provided for making the fourth transistor nonconductive when no control signal is applied thereto.

It is therefore an object of the invention to provide a gain control circuit which achieves a wide range of gain control.

It is another object of the invention to provide a gain control circuit which is provided with few external terminals and is suitable for manufacture in integrated circuit form.

It is yet another object of the invention to provide a gain control circuit which is operable with an electric power source of low voltage.

The foregoing and other objects, features and advantages of the invention will be more readily understood upon consideration of the following description of certain preferred embodiments of the invention, taken in conjunction with the accompanying drawings.

DESCRIPTION OF CERTAIN PREFERRED EMBODIMENTS

Figures 1, 3, 4:
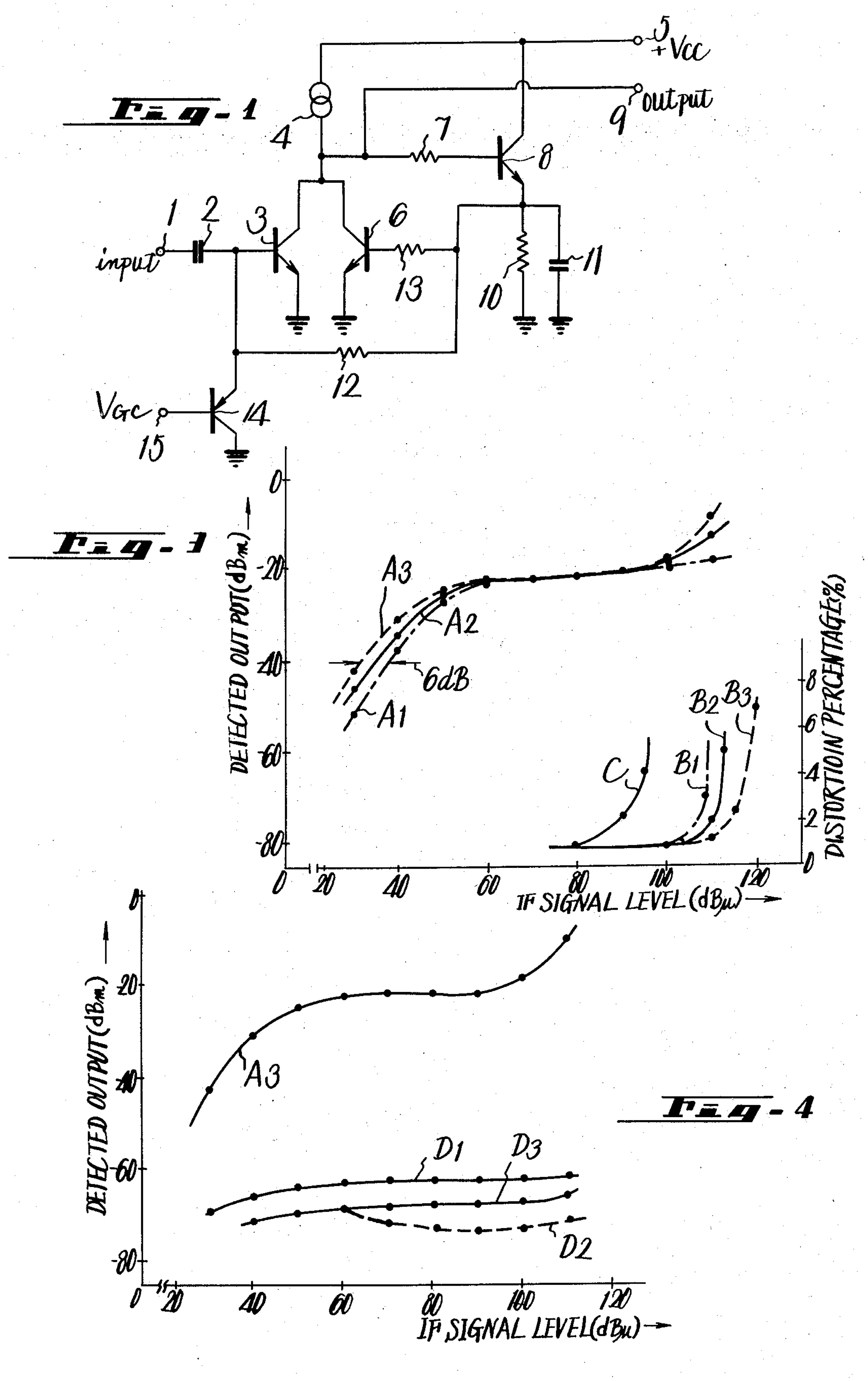
FIG. 1 is a schematic diagram of a gain control circuit according to one embodiment of the invention.
FIGS. 3 and 4 are graphs illustrating the characteristics of the embodiment depicted in FIG. 2.

With reference to FIG. 1, one embodiment of a gain control circuit according to the invention will be hereinafter described. In FIG. 1 reference numeral 1 designates an input signal terminal which is connected through a capacitor 2 to the base of a first NPN-type transistor 3. The first transistor 3 is connected to the circuit ground at its emitter. Its collector is connected through a constant current source 4 to an electric power source terminal 5 to which a positive voltage +Vcc is applied. The constant current source 4 may be, for example, a resistor of high resistance value. The collector of the transistor 3 is also connected to the collector of a second NPN-type transistor 6 the emitter of which is grounded. The connection point between the collectors of both the transistors 3 and 6 is connected through a resistor 7 to the base of a third NPN-type transistor 8 and also to an output terminal 9. The transistor 8 is connected at its collector to the power source terminal 5 and at its emitter to the circuit ground through a parallel circuit of a resistor 10 and a by-pass capacitor 11. In some embodiments the resistor 10 is replaced with an impedance element such as a transistor or the like.

The emitter of the third transistor 8 is connected to the base of the first transistor 3 through a resistor 12 and also to the base of the second transistor 6 through a resistor 13, whereby the bases of both the transistors 3 and 6 are supplied with a DC bias voltage. The base of the transistor 3 is connected to the emitter of an opposite conductivity type transistor, namely a PNP-type transistor 14.

The collector of transistor 14 is grounded. The base of the transistor 14 is connected to an input terminal 15 to which an external gain control voltage $V_{GC}$ is applied. In order to maximize the gain of the circuit, the base of the transistor 14 is supplied through the terminal 15 with a bias voltage of sufficient magnitude and polarity to make the transistor 14 essentially nonconductive. The base of the transistor 3 is typically supplied with DC voltage of 0.5 to 0.3 volts which is slightly smaller than its base to emitter voltage $V_{BE}$ (0.7 volts).

When a signal is applied to the base of the transistor 3 from the input terminal 1, an output is derived from the collector of the transistor 3 and hence from the output terminal 9. If a gain control voltage which is less than that supplied for maximum gain is applied to the terminal 15, the transistor 14 is made conductive, so that the base current of the transistor 3 applied through the resistor 12 is by-passed through the transistor 14 to reduce the collector current of the transistor 3. As a result, the gain of the transistor 3 is decreased to reduce its output signal. Furthermore, since the signal applied to the base of the transistor 3 is also by-passed through the transistor 14 to reduce its level, the control range of the circuit can be made quite wide. The impedance of the transistor 14 across its collector-emitter is varied in accordance with the voltage applied to the terminal 15, so that the gain of the circuit can be freely varied by changing the gain control voltage.

As the collector potential of the transistor 3 increases when its collector current is reduced due to the application of a gain control signal to terminal 15, the collector current of the transistor 8 increases to increase its emitter voltage since the base of transistor 8 is connected to the collector of the transistor 3. This increased emitter voltage is applied as a DC feedback bias to the base of the transistor 6 and therefore the collector current of the transistor 6 also increases. Because the current flowing into the transistors 3 and 6 is kept substantially constant by the constant current source 4, the output obtained at the output terminal 9 is thereby maintained constant in level. The by-pass capacitor 11 is connected in parallel to the resistor 10 so that DC feedback is applied to the transistor 6 but no AC feedback is applied thereto.

The DC bias from the emitter of transistor 8 is also applied to the transistor 3 through the resistor 12 and therefore the DC feedback mentioned above is also applied thereto. Accordingly, the transistor 3 is made free from the influence of voltage variations in the power source voltage Vcc and also the influence of temperature changes and so on.

Further, since only two capacitors are employed in the embodiment, the circuit can easily be made as an integrated circuit (IC) with the two capacitors 2 and 11 being connected to the circuit from the outside.

In the embodiment of FIG. 1, an output is derived from the collector of the transistor 3, but the output may also be derived from the collector of the transistor 8. In this case, the capacitor 11 is required to be connected in parallel with the resistor 10 as shown in FIG. 1. It is, however, possible in other embodiments to connect the capacitor 11 between the base of the transistor 8 and the circuit ground when the output is derived from the collector of the transistor 3.

The transistor 14 is used as a variable impedance element in the example, but an FET may be employed in place of the transistor 14.

Figure 2:
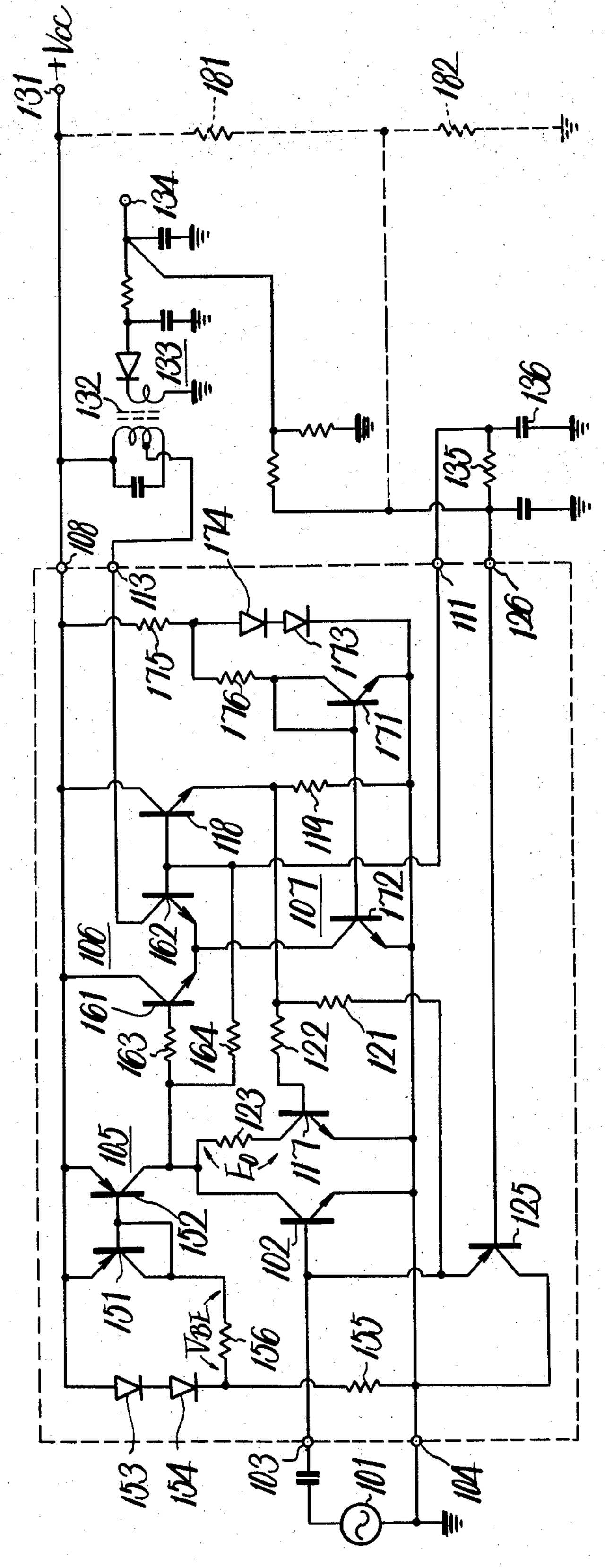
FIG. 2 is a schematic diagram of another embodiment of the invention in which the invention is employed as an automatic gain control (AGC) circuit.

FIG. 2 shows a second embodiment of the invention as an AGC circuit in an IF amplifying stage of a radio receiver. In FIG. 2 reference numeral 101 indicates a signal source of an IF signal. An NPN transistor 102 is connected at its base to the signal source 101 through an input terminal 103, at its emitter to the circuit ground through a common terminal 104 and at its collector to a constant current source designated generally as 105. The constant current source 105 includes a pair of PNP transistors 151 and 152 the emitters of which are connected together to an electric power source terminal 108 and the bases of which are connected together and through a resistor 156 to the connection point between a resistor 155 and two diodes 153 and 154. The diodes 153, 154 and the resistor 155 are connected in series between the terminals 104 and 108. The polarity of the diodes is oriented to pass current in the direction from the terminal 108 to the terminal 104. The collector of the transistor 151 is connected directly to its base and the collector of the transistor 152 is connected to the collector of the transistor 102.

The reference numeral 106 indicates generally a differential amplifier to which the output signal obtained at the collector of the transistor 102 is applied. The differential amplifier 106 includes NPN transistors 161 and 162, the bases of which are connected to the collector of the transistor 102 through resistors 163 and 164, respectively. The transistor 162 is further connected at its base to a by-pass terminal 111. Its collector is connected to an output terminal 113 and the collector of the transistor 161 is connected to the terminal 108. The emitter of both the transistors 161 and 162 are connected together to a second constant current source 107 which includes the NPN transistors 171 and 172. Thus, the emitters of the transistors 161 and 162 are connected to the terminal 104 through the collector-emitter junction of the transistor 172. The base of the transistor 172 is connected to the base and collector of the transistor 171. The base of the transistor 172 is further connected through a resistor 176 to the connection point between a resistor 175 and a series connection of diodes 173 and 174. The resistor 175 is connected between the terminal 108 and the anode of diode 174. The cathode of diode 174 is connected to the anode of diode 175, whose cathode is connected to terminal 104. The emitter of the transistor 171 is connected to the terminal 104 directly.

The base of the transistor 162 is connected to the base of an NPN transistor 118. The collector of transistor 118 is connected to the terminal 108 and its emitter is connected to the terminal 104 through a resistor 119. Accordingly, the transistor 118 is connected as an emitter-follower type. The emitter of the transistor 118 is also connected to the base of the transistor 102 and to the base of an NPN transistor 117 through resistors 121 and 122, respectively. The emitter of the transistor 117 is connected to the terminal 104 and its collector is connected through a resistor 123 to the collector of the transistor 102.

For AGC operation there is provided a PNP transistor 125 which is connected at its collector to the terminal 104, at its emitter to the terminal 103 and at its base to a control terminal 126.

When the circuit composed as mentioned above is made as an integrated circuit (IC), the portion except the signal source 101, that is, that surrounded by the dotted line block in FIG. 2 is made as an IC. In the example shown in FIG. 2, since the invention is incorporated in a radio receiver as an AGC circuit, other circuit elements are provided in addition thereto as shown. The terminal 108 is connected to an electric power supply terminal 131 and the terminal 113 is connected to the terminal 131 through the primary winding of an IF transformer 132. To the secondary winding of the transformer 132 is connected a detecting circuit 133 the detected output from which is delivered to an output terminal 134 and at the same time to the terminal 126 as an AGC signal. When there is no signal or a feeble signal, in order to make the transistor 125 nonconductive a resistor 135 is inserted between the terminals 111 and 126 and a constant voltage is supplied to the transistor 125 from the terminal 111. The terminal 111 is grounded through a by-pass capacitor 136.

Since the transistor 151 of the constant current source 105 is connected in the manner of a diode, its collector-emitter voltage $V_{BE}$ is constant. The voltage across the series connection of the diodes 153 and 154 is $2V_{BE}$ which is also constant with the result that the voltage across the resistor 156 becomes $V_{BE}$. Accordingly, if the resistance value of the resistor 156 is taken as $R_1$, the constant current determined by $V_{BE}/R_1$ flows through the resistor 156, but this constant current is also the collector current of the transistor 151 (in this case, its base current is also contained therein but the base current is negligible). Further, since the transistors 151 and 152 are connected together at their bases and the same base bias is applied thereto, the same collector current flows through the transistors 151 and 152, respectively, with the result that the constant current of $V_{BE}/R_1$ flows through the collector of the transistor 152. In other words, the transistor 152 acts as a constant current source. The same operation is also achieved in the second constant current source 107.

In the illustrated circuit, DC negative feedback is applied to the transistors 102 and 117, respectively, through the series circuit which includes the collectors of the transistors 102 and 117, the resistor 164, the base of the transistor 118, the emitter of transistor 118, and the resistor 121 connected to the base of the transistor 102 and the resistor 122 connected to the base of the transistor 117. The base bias is respectively applied to the transistors 161, 162 and 118 through the resistors 163 and 164 and the base bias is applied to the transistors 102 and 117 respectively, through the resistors 121 and 122. Since the base of the transistor 118 is by-passed through the capacitor 136, no AC negative feedback is applied through the above DC negative feedback loops. At the same time, the base of the transistor 162 is also by-passed through the capacitor 136, so that an amplified output can be obtained at the collector of the transistor 162 when the transistor 161 is supplied with a signal at its base.

When an IF signal is applied to the terminal 103, it is amplified by the transistor 102 and the amplified IF signal appearing at its collector is amplified by the differential amplifier 106. The output of the differential amplifier 106 at the collector of the transistor 162 is delivered to the terminal 113 and its detected output is obtained at the terminal 134. As the IF signal becomes increased, an AGC signal is applied from the terminal 134 to the terminal 126 and the transistor 125 is changed to its conductive or ON-state from its non-conductive or OFF-state so that it passes an emitter-collector current. As a result, the base current of the transistor 102 applied through the resistor 121 is by-passed through the emitter-collector of the transistor 125 and is thereby reduced to decrease the collector current of the transistor 102. Accordingly, the gain of the transistor 102 is reduced to achieve the AGC operation.

Although the collector current of the transistor 102 is reduced, current flowing through the transistors 102 and 117 is restricted by the constant current source 105 and the base current of the transistor 117 is increased through the DC negative feedback loop mentioned above. As a result, the collector current of the transistor 117 is increased by the extent that the collector current of the transistor 102 is decreased. Accordingly, there occurs no DC voltage variation with respect to whole the circuit.

Simultaneously with the AGC operation, the impedance across the emitter-collector of the transistor 125 is reduced by the AGC signal with the result that the IF signal applied to the terminal 103 is by-passed through the emitter-collector of the transistor 125 and the AGC operation is thereby enhanced.

If it is desired to make the circuit as an IC it is enough to make its part surrounded by the dashed line block in FIG. 2 as one IC chip. The external terminals which must be provided are the input terminal 103, output terminal 113, control terminal 126, power source terminal 108, common terminal 104 and also the by-pass terminal 111.

Further, in this invention an input signal is amplified by the transistor 102 and the differential amplifier 106, so that the total gain of the circuit becomes as high as 50 to 60 dB.

In addition, in this invention the collector current of the transistor 102 is varied by the impedance variation of the transistor 125 to change the gain of the transistor 102 and to achieve level control, but the level control is also achieved by by-passing the input signal, so that the level control is carried out over a wide range and a constant output can be obtained in a range of 50 to 60 dB from an input signal with high distortion characteristics.

The minimum power source voltage Vcc is substantially determined as the sum of the base-emitter voltage $V_{BE}$ of the transistor 102, the base-emitter voltage $V_{BE}$ of the transistor 118 and the collector-emitter voltage (which is equal to the collector-emitter voltage of the transistor 151, namely to $V_{BE}$), so that the minimum power source voltage Vcc is selected to be at least 3 $V_{BE}$ and is in the order of 2 to 3 volts. Further, in this invention DC negative feedback is applied to the whole of the circuit, so that the gain thereof is less influenced by the variation of the power source voltage Vcc.

Since the resistor 123 is connected in series to the collector of the transistor 117, even if a noise produced by the resistor 122 is amplified by the transistor 117, the amplified noise is prevented from being applied to the differential amplifier 106 by the resistor 123. Accordingly, the signal to noise ratio is improved in the circuit of the invention over prior art circuits.

The constant current $V_{BE}/R_1$ delivered from the collector of the transistor 152 is shunted to the transistor 117 in accordance with the control signal from the terminal 126, but if the shunt rate of this embodiment is taken as $a$, the collector current of the transistor 117 is expressed as $a$ times $V_{BE}/R_1$. Accordingly, if the resistance value of the resistor 123 is taken as $R_2$, a voltage $E_0$ across it is expressed as $E_0 = a \times V_{BE} \times R_2/R_1$. Consequently, in the case where the circuit is desired to be made as one IC chip, if the resistors 123 and 156 are formed with same variation, the terminal voltage $E_0$ becomes constant irrespective of their variations. Accordingly, the collector potentials of the transistor 117 can be maintained at a predetermined level even when the transistor 102 is in its OFF-state and the transistor 117 is in its ON-state irrespective of the variation or non-uniformity of the resistor 123.

FIGS. 3 and 4 are graphs illustrating the results obtained by measuring the AGC characteristics of the circuit shown in FIG. 2. In FIG. 3, curves $A_1$, $A_2$ and $A_3$ show the relationship between an input level and an output level (an IF signal level and a detected output level) with the power source voltage Vcc being 2.5, 4 and 10 volts, respectively, while curves $B_1$, $B_2$ and $B_3$ show distortion characteristics of the invention with the voltage Vcc being 2.5, 4 and 10 volts, respectively and a curve C shows a distortion characteristic of a conventional AGC circuit.

In FIG. 4 a curve $D_1$ shows a noise level characteristic with the resistor 123 being omitted, a curve $D_2$ a noise level characteristic with the resistor 123 and a curve $D_3$ a noise level characteristic with the resistor 123 being omitted and the base of the transistor 117 being short-circuited with a capacitor (of 0.1 F in capacity).

As is apparent from the result of measurement shown in FIGS. 3 and 4, with the invention the level control range is as wide as 50 to 60 dB, the level difference due to variation of the power source voltage Vcc is small (6 dB for the output level of −40 dBm), the distortion characteristic for a large input is much improved and the noise level is low.

In the embodiment of FIG. 2, the base of the transistor 125 is supplied with bias voltage from the terminal 111 through the resistor 135 by utilizing the fact that the base potential of the transistors 118 and 162 is not changed irrespective of an input IF signal, so that the circuit is simple in construction and stable in operation.

In other embodiments a series connection of resistors 181 and 182 is inserted between the terminal 131 and the circuit ground as shown in FIG. 2 by dotted lines and the connection point between the resistors 181 and 182 is connected to the terminal 126. In these embodiments the resistor 135 can be omitted.

In still other embodiments the DC feedback supplied by the transistor 118 is obtained by connecting the emitters of the transistors 161 and 162 of the differential amplifier 106 through the resistors 121 and 122 to the bases of the transistors 102 and 117, respectively.

The terms and expressions which have been employed here are used as terms of description and not of limitation, and there is no intention in the use of such terms and expressions, of excluding equivalents of the features shown and described, or portions thereof, it being recognized that various modifications are possible within the scope of the invention claimed.

What is claimed is:

1. A gain control circuit comprising a circuit ground, first and second transistors each having base, emitter and collector electrodes respectively, means for connecting the collector electrodes of the first and second transistors to each other, means for connecting the emitter electrodes of the first and second transistors to the circuit ground, means for applying an input signal between the base electrode of the first transistor and the circuit ground, a constant current source connected to the collector electrode of the first transistor, means for applying DC bias to the base electrodes of the first and second transistors, respectively, in direct response to changes in the DC voltage at the collector electrode of the first transistor, and by-pass means connected between the base electrode of the first transistor and the circuit ground.

2. A gain control circuit as recited in claim 1 wherein means are provided to derive an output signal from the collector electrode of the first transistor.

3. A gain control circuit as recited in claim 1 wherein the DC bias applying means includes a third transistor having base, emitter and collector electrodes, means for connecting the base electrode of the third transistor to the collector electrode of the first transistor, impedance means for connecting the emitter electrode of the third transistor to the circuit ground, and means for connecting the emitter electrode of the third transistor to the base electrodes of the first and second transistors, respectively.

4. A gain control circuit as recited in claim 1 wherein the by-pass means includes a variable impedance means to by-pass the input signal and the DC bias applied to the base electrode of the first transistor.

5. A gain control circuit as recited in claim 4 wherein the variable impedance means includes a fourth transistor which is opposite to the first transistor in conductivity type.

6. A gain control circuit as recited in claim 5 in which the fourth transistor is connected at its emitter electrode to the base electrode of the first transistor, its collector electrode is connected to the circuit ground, and its base electrode is supplied with an external control signal.

7. A gain control circuit as recited in claim 6 wherein means are provided for biasing the fourth transistor into its non-conductive state when no control signal is applied thereto.

* * * * *